United States Patent
Hayashi

(10) Patent No.: US 6,650,192 B2
(45) Date of Patent: Nov. 18, 2003

(54) METHOD FOR ADJUSTING CHARACTERISTICS OF VOLTAGE CONTROL TYPE OSCILLATOR

(75) Inventor: Yasuhiro Hayashi, Komatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/826,541

(22) Filed: Apr. 5, 2001

(65) Prior Publication Data

US 2001/0028279 A1 Oct. 11, 2001

(30) Foreign Application Priority Data

Apr. 5, 2000 (JP) ........................................ 2000-103021

(51) Int. Cl.[7] ................................................ H03B 1/00
(52) U.S. Cl. ................................... 331/68; 331/107 SL
(58) Field of Search ....................... 331/107 SL, 177 R, 331/68

(56) References Cited

U.S. PATENT DOCUMENTS

| | | | |
|---|---|---|---|
| 4,001,711 A | * | 1/1977 | Knutson et al. ............. 330/306 |
| 4,110,640 A | | 8/1978 | Ito ............................. 307/303 |
| 5,087,896 A | * | 2/1992 | Wen et al. ..................... 29/593 |
| 5,654,676 A | * | 8/1997 | Avanic et al. ............... 257/708 |
| 5,952,901 A | | 9/1999 | Nakano |

FOREIGN PATENT DOCUMENTS

JP          5-283933          10/1993

* cited by examiner

Primary Examiner—Robert Pascal
Assistant Examiner—Joseph Chang
(74) Attorney, Agent, or Firm—Keating & Bennett, LLP

(57) ABSTRACT

A method for adjusting a voltage control type oscillator prevent changes in characteristics from occurring after adjustments and permits the oscillator to be produced at a low cost. The voltage control type oscillator includes a strip electrode provided on a first surface of a dielectric substrate and a ground electrode provided on a second surface of the dielectric substrate. The strip electrode and the ground electrode constitute a microstrip line resonator. In addition to the resonator, electric components are mounted on the first surface of the dielectric substrate. A case is attached to the dielectric substrate such that the case covers the strip electrode and the electronic components. After attaching the case, the strip electrode is trimmed by irradiating a laser beam from the second surface side of the dielectric substrate.

20 Claims, 2 Drawing Sheets

METHOD FOR ADJUSTING CHARACTERISTICS OF VOLTAGE CONTROL TYPE OSCILLATOR

BACKGROUND OF THE INVENTION

1. Field of the Invention

The present invention relates to methods for adjusting voltage control type oscillators. More particularly, the present invention relates to methods for adjusting the frequencies and control-voltage sensitivities of voltage control type oscillators including microstrip line resonators.

2. Description of the Related Art

For example, as shown in FIG. 2, in a conventional voltage control type oscillator 1 including a microstrip line resonator, a strip electrode 3 is provided on a first surface of a dielectric substrate 2, and a ground electrode 4 is provided on a second surface of the dielectric substrate 2. In the voltage control type oscillator 1, in addition to a resonator defined by a microstrip line, electronic components 5 are mounted on the first surface of the dielectric substrate 2. In order to adjust the frequency and control voltage of the voltage control type oscillator 1, the strip electrode 3 is trimmed. In this case, trimming is performed by irradiating a laser beam on the strip electrode 3. In this manner, after trimming the strip electrode 3, a case for covering the strip electrode 3 and the electronic components 5 is attached to the dielectric substrate 2.

In addition, in FIG. 3, there is shown another conventional voltage control type oscillator including a microstrip line resonator disposed on a multi-layer substrate. In a voltage control type oscillator 1, a strip electrode 3 is disposed inside a dielectric substrate 2. Then, two ground electrodes 4 and 6 are arranged to sandwich the strip electrode 3 therebetween. Like the ground electrode shown in FIG. 2, the ground electrode 4 is disposed on the second surface of the dielectric substrate 2. The ground electrode 6 is disposed inside the dielectric substrate 2. Electronic components 5 are mounted on the first surface of the dielectric substrate 2, and a case 7 is attached to the dielectric substrate 2 such that the case 7 covers the electronic components 5. In this voltage control type oscillator 1, after attaching the case 7, trimming of the strip electrode 3 is performed. In this case, a laser beam is irradiated from the second surface side of the dielectric substrate 2 to trim the strip electrode 3.

However, as shown in FIG. 2, when trimming the strip electrode from above, since the case 7 is attached after the trimming, a magnetic-field change occurs, thereby causing changes in various characteristics including frequency characteristics. In addition, depending on the state in which the case 7 is attached, there are generated variations between the characteristic changes, which increases variations in the characteristics between produced voltage control type oscillators.

In addition, as shown in FIG. 3, when attaching the cover on the first surface of the multi-layer substrate having a circuit disposed thereon and trimming the strip electrode from the second surface side of the multi-layer substrate, the distances between the strip electrode disposed inside the multi-layer substrate and the ground electrodes sandwiching the strip electrode therebetween are narrow. Thus, noise characteristics such as C/N characteristics (carrier/noise ratio) are deteriorated. Furthermore, in the case of the multi-layer substrate, a substrate material cost is higher than the case using the dielectric substrate having the strip electrode disposed thereon.

SUMMARY OF THE INVENTION

In order to overcome the problems described above, preferred embodiments of the present invention provide a method for adjusting a voltage control type oscillator that prevents characteristic changes occurring after adjustments and permits the voltage control type oscillator to be produced at a low cost.

According to a preferred embodiment of the present invention, a method for adjusting a voltage control type oscillator includes the steps of forming a strip electrode on a first surface of a dielectric substrate, forming a ground electrode on a second surface of the dielectric substrate, providing a case which covers the strip electrode on the first surface of the dielectric substrate, and trimming the strip electrode from the second surface side of the dielectric substrate after the case is provided.

In addition, in the method for adjusting the voltage control type oscillator, the strip electrode may be trimmed by a laser.

By using a microstrip line resonator including the strip electrode provided on the first surface of the dielectric substrate and the ground electrode provided on the second surface thereof, the substrate material cost is much lower than the case of the multi-layer substrate. In addition, since the method can widen the distance between the strip electrode and the ground electrode, the voltage control type oscillator can have satisfactory characteristics.

Furthermore, trimming is performed from the second surface side of the dielectric substrate after the case is provided on the first surface of the dielectric substrate. That is, since the cover is not attached after adjustments, this arrangement can prevent characteristic changes occurring after adjustments.

Other processes, features, characteristics and advantages of the present invention, will be further clarified by the detailed explanation of preferred embodiments shown below with reference to the attached drawings.

DETAILED DESCRIPTION OF PREFERRED EMBODIMENTS

Figure 1:
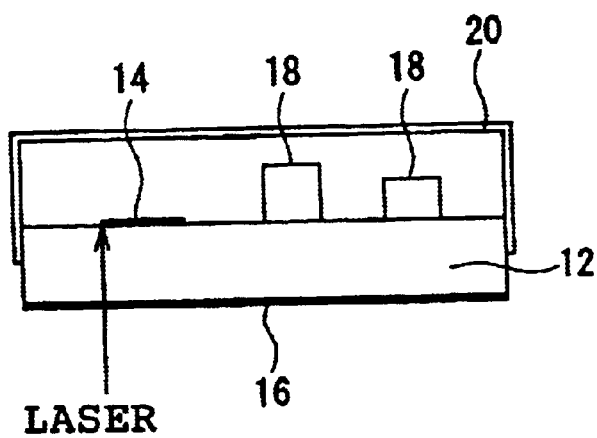
FIG. 1 shows an illustration for explaining a method for adjusting a voltage control type oscillator according to a preferred embodiment of the present invention.
Figure 2:
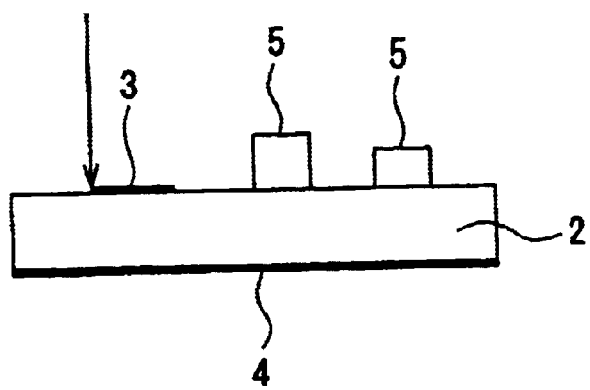
FIG. 2 shows an illustration for explaining a conventional method for adjusting a voltage control type oscillator.
Figure 3:
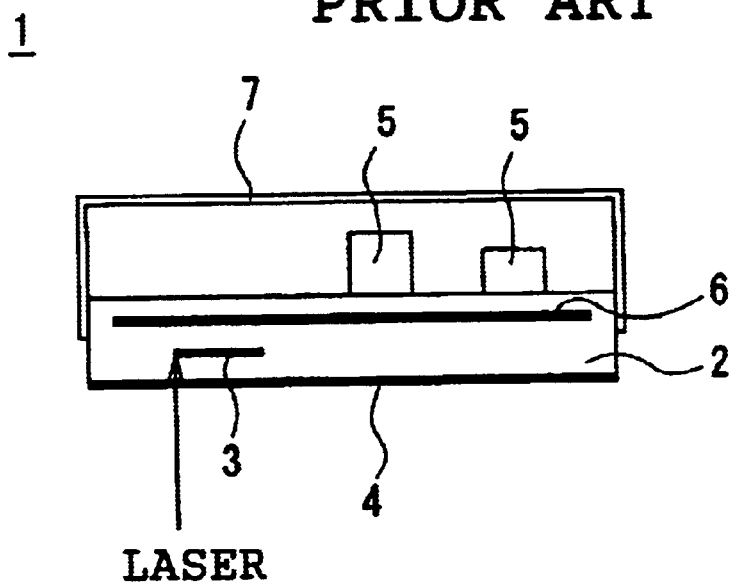
FIG. 3 shows an illustration for explaining another conventional method for adjusting a voltage control type oscillator.

FIG. 1 illustrates an example of a voltage control type oscillator used in an adjustment method according to a preferred embodiment of the present invention. A voltage control type oscillator 10 includes a dielectric substrate 12. On a first surface of the dielectric substrate 12, for example, a line-shaped strip electrode 14 is preferably provided. On a second surface of the dielectric substrate 12, a ground electrode 16 is formed along the entire surface thereof. The dielectric substrate 12, the strip electrode 14, and the ground electrode 16 constitute a microstrip line resonator.

In addition to the microstrip line resonator, electronic components 18 are provided on the first surface of the dielectric substrate 12. The microstrip line resonator and the electronic components 18 constitute the voltage control type oscillator 10. A metal case 20 is attached to the first surface of the dielectric substrate 12 such that the case 20 covers the strip electrode 14 and the electronic components 18.

In the voltage control type oscillator 10, the frequency and control-voltage sensitivity of the oscillator are adjusted by trimming the strip electrode 14. In this case, for example, the strip electrode 14 is trimmed by irradiating a laser beam from the second surface side of the dielectric substrate 12. The laser-trimming is performed after the case 20 is attached to the first surface of the dielectric substrate 12. When the laser beam is irradiated, slits are formed both in the dielectric substrate 12 and the ground electrode 16. However, as long as the widths of the slits are narrow, there is almost no influence upon the characteristics of the oscillator 10.

In the above-described method, after the case 20 is attached, the strip electrode 14 is trimmed. Thus, the method can prevent characteristic changes occurring when the case 20 is attached after adjustments. For example, it is assumed that in a voltage control type oscillator of about 2 GHz band, the case is attached after trimming the strip electrode 14 on the first surface of the dielectric substrate 12. In this case, the frequency change is approximately 10% (200 MHz). Furthermore, depending on the state of covering with the case, there are generated variations of approximately 0.5% (±10 MHz). In other words, in the conventional method, the frequency change amounts to 200±10 MHz, whereas in preferred embodiments of the present invention, the occurrence of frequency change can be 0 MHz when the case 20 is attached.

Furthermore, since the method of preferred embodiments of the present invention includes the microstrip line resonator defined by the strip electrode 14 and the ground electrode 16 disposed on the surfaces of the dielectric substrate 12, the distance between the strip electrode 14 and the ground electrode 16 can be made greater than the distance between both electrodes in an oscillator using a multi-layer substrate. As a result, noise characteristics such as C/N (carrier to noise) characteristics are greatly improved. For example, in order to check a C/N ratio at a detuning frequency of about 60 kHz, a product comparison was made between the voltage control type oscillator using the resonator defined by the strip electrode 14 and the ground electrode 16 provided on the main surfaces of the dielectric substrate 12 and the voltage control type oscillator using the multi-layer substrate. In this comparison, the C/N ratio of the latter oscillator was approximately 124.6 dBc/Hz, whereas the C/N ratio of the former oscillator was approximately 125.9 dBc/Hz. Therefore, the noise characteristics were improved by about 1.3 dBc.

Furthermore, the oscillator having the electrodes 14 and 16 disposed on the main surfaces of the dielectric substrate is manufactured much more cheaply than the oscillator using the multi-layer substrate. Thus, since the substrate material cost is greatly reduced, the voltage control type oscillator 10 can be produced at a very low cost.

As described above, in preferred embodiments of this invention, since the strip electrode is trimmed after attaching the case, the characteristic changes of the oscillator caused by attaching the case are prevented. In addition, the oscillator of preferred embodiments of the present invention includes the microstrip line resonator defined by the strip electrode and the ground electrode disposed on the main surfaces of the dielectric substrate. With this arrangement, as compared with the oscillator using a multi-layer substrate, in the oscillator of preferred embodiments of the present invention, noise characteristics such as C/N characteristics are greatly improved, and furthermore, the voltage control type oscillator is produced at a very low cost.

While preferred embodiments of the present invention have been described above, it should be understood that the implementation of other variations and modifications of the invention and its various aspects will be apparent to those skilled in the art, and that the present invention is not limited by the specific preferred embodiments described above. Therefore, it is contemplated to cover the present invention any and all modifications, variations, or equivalents that fall within the true spirit and scope of the basic underlying principles disclosed and claimed herein.

What is claimed is:

1. A method for adjusting a voltage control type oscillator comprising the steps of:
    forming a strip electrode on a first surface of a dielectric substrate;
    forming a ground electrode on a second surface of the dielectric substrate;
    providing a case which covers the strip electrode on the first surface of the dielectric substrate; and
    trimming the strip electrode from the second surface side of the dielectric substrate after the case is provided on the dielectric substrate; wherein
    the ground electrode is formed along the entire second surface of the dielectric substrate.

2. The method according to claim 1, wherein the strip electrode is trimmed by a laser.

3. The method according to claim 1, wherein the strip electrode is line-shaped.

4. The method according to claim 1, wherein the dielectric substrate, the strip electrode, and the ground electrode constitute a microstrip line resonator.

5. The method according to claim 1, wherein the case is made of metal.

6. The method according to claim 1, further comprising the step of mounting electronic components provided on the first surface of the dielectric substrate.

7. The method according to claim 6, wherein the dielectric substrate, the strip electrode, and the ground electrode constitute a microstrip line resonator and the microstrip line resonator and the electronic components constitute the voltage control type oscillator.

8. The method according to claim 6, wherein the case is attached to the first surface of the dielectric substrate such that the case covers the strip electrode and the electronic components.

9. The method according to claim 1, wherein the strip electrode is trimmed by irradiating a laser beam from the second surface side of the dielectric substrate.

10. The method according to claim 9, wherein the laser beam is irradiated such that slits are formed both in the dielectric substrate and the ground electrode.

11. A method for adjusting a voltage control type oscillator comprising the steps of:
    forming a strip electrode on a first surface of a dielectric substrate;
    forming a ground electrode on a second surface of the dielectric substrate;
    providing a case which covers the strip electrode on the first surface of the dielectric substrate; and
    trimming the strip electrode from the second surface side of the dielectric substrate after the case is provided on the dielectric substrate; wherein
    the dielectric substrate, the strip electrode, and the ground electrode constitute a microstrip line resonator.

12. The method according to claim 11, wherein the strip electrode is trimmed by a laser.

13. The method according to claim 11, wherein the strip electrode is line-shaped.

14. The method according to claim 11, wherein the ground electrode is formed along the entire second surface of the dielectric substrate.

15. The method according to claim 11, further comprising the step of mounting electronic components provided on the first surface of the dielectric substrate.

16. The method according to claim 15, wherein the microstrip line resonator and the electronic components constitute the voltage control type oscillator.

17. The method according to claim 11, wherein the case is made of metal.

18. The method according to claim 15, wherein the case is attached to the first surface of the dielectric substrate such that the case covers the strip electrode and the electronic components.

19. The method according to claim 11, wherein the strip electrode is trimmed by irradiating a laser beam from the second surface side of the dielectric substrate.

20. The method according to claim 19, wherein the laser beam is irradiated such that slits are formed both in the dielectric substrate and the ground electrode.

* * * * *